(12) United States Patent
Peng et al.

(10) Patent No.: US 11,462,627 B2
(45) Date of Patent: Oct. 4, 2022

(54) MANUFACTURING METHOD FOR A SEMICONDUCTOR DEVICE

(71) Applicant: SHANGHAI HUALI MICROELECTRONICS CORPORATION, Shanghai (CN)

(72) Inventors: Xiang Peng, Shanghai (CN); Haoyu Chen, Shanghai (CN); Qiwei Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 17/244,620

(22) Filed: Apr. 29, 2021

(65) Prior Publication Data
US 2022/0052180 A1 Feb. 17, 2022

(30) Foreign Application Priority Data
Jun. 2, 2020 (CN) .......................... 202010489472.3

(51) Int. Cl.
*H01L 29/66* (2006.01)
(52) U.S. Cl.
CPC .. *H01L 29/66492* (2013.01); *H01L 29/66825* (2013.01)

(58) Field of Classification Search
CPC ................................................ H01L 27/11531
See application file for complete search history.

(56) References Cited

U.S. PATENT DOCUMENTS

| 11,018,147 B1* | 5/2021 | Kim ................. H01L 29/42328 |
| 2008/0185635 A1* | 8/2008 | Yanagi ................ H01L 27/115 |
| | | 257/E27.06 |

* cited by examiner

*Primary Examiner* — Xiaoming Liu
(74) *Attorney, Agent, or Firm* — Alston & Bird LLP

(57) ABSTRACT

The present invention provides a manufacturing method for a semiconductor memory device. The method comprises: providing a substrate, wherein a gate structure of a memory transistor is formed on a memory area of the substrate, and a first layer used for forming a gate structure of a peripheral transistor is formed on a peripheral area of the substrate; performing lightly doped drain ion implantation on an upper part of a portion, on two sides of the gate structure of the memory transistor, of the memory area of the substrate by applying the first layer as a mask of the peripheral area; and etching the first layer to form the gate structure of the peripheral transistor. According to the present invention, an ion diffusion degree of source and drain electrodes of the memory area may be effectively increased, and the uniformity of a memory cell device is improved.

6 Claims, 5 Drawing Sheets

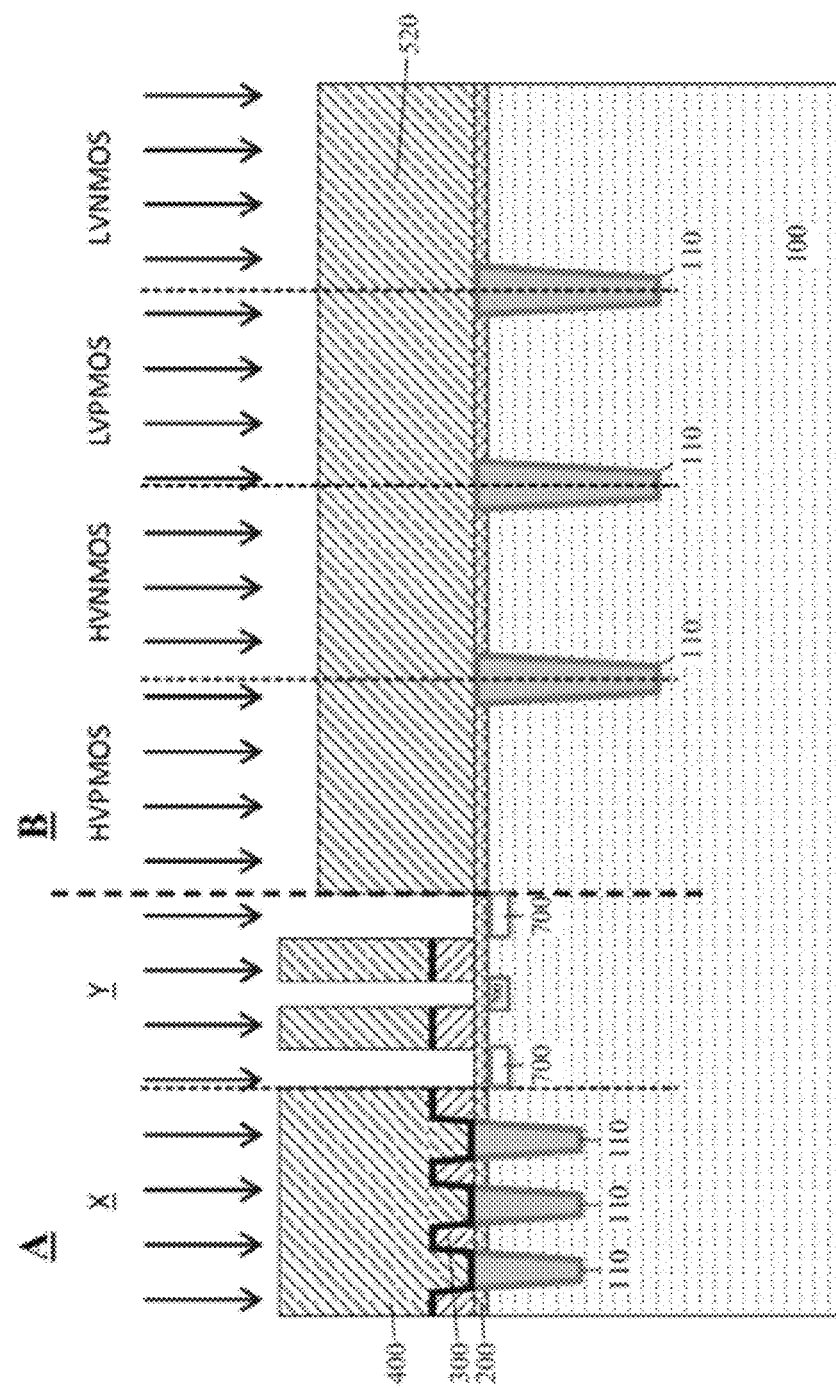

MANUFACTURING METHOD FOR A SEMICONDUCTOR DEVICE

CROSS-REFERENCES TO RELATED APPLICATIONS

This application claims priority to Chinese patent application No. CN202010489472.3 filed on Jun. 2, 2020, and entitled "MANUFACTURING METHOD FOR A SEMICONDUCTOR DEVICE", the disclosure of which is incorporated herein by reference in entirety.

TECHNICAL FIELD

The present invention relates to semiconductor device manufacturing technology, in particular, to a manufacturing method for a flash memory.

BACKGROUND

Flash memory devices have the advantages of non-volatility, easy programming and erasing, long service life, and low cost, etc. and have been widely applied to various fields including consumer electronics, network communication apparatuses, industrial instrument and meter embedded systems, automobile devices, etc.

In existing flash memory device structures, a NOR flash structure, for example, has three different gates:

1. a floating gate (also abbreviated as FG) of a memory transistor in a memory area, which is a basic data storage cell;

2. a control gate (also abbreviated as CG) of the memory transistor in the memory area, which is located over the floating gate, wherein an insulator is arranged between the floating gate and the control gate, and the control gate controls erasing, writing and reading of data in the floating gate; and 3. polycrystalline gates (also abbreviated as poly gate or PG) of various devices in a peripheral logic control area, wherein it can be understood that various devices in the peripheral logic control area may include a high-voltage P-type MOS transistor (HVPMOS), a high-voltage N-type MOS transistor (HVNMOS), a low-voltage P-type MOS transistor (LVPMOS), and a low-voltage N-type MOS transistor (LVNMOS), etc.

In the related arts, polycrystalline silicon of the CG and polycrystalline silicon of the PG grow simultaneously. Because of the differences of design rules and film structures, the polycrystalline silicon of the CG and the polycrystalline silicon of the PG are separately etched, the polycrystalline silicon of the CG is etched firstly to form the CG, and then the polycrystalline silicon of the PG is etched to form the PG. Different gate structures after etching are shown in FIG. 1. As shown in FIG. 1, a FG 300 and a CG 400 of the memory transistor are formed on the memory area A of the substrate 100, and various peripheral device poly gates 500 are formed on a peripheral logic control area B of the substrate 100.

For the flash memory device, cell lightly doped drain (Cell LDD) ion implantation is generally required on the memory transistor in the memory area, so as to inhibit a hot electron effect thereof. In the existing process, after the polycrystalline silicon of the CG and polycrystalline silicon of the PG are etched separately to form the CG and the PG, gate re-oxidation and self-aligned source etching, implantation and annealing processes are performed, and then a process step of lightly doped drain ion implantation for the transistor in the memory area is performed. That is, in the existing process, after the source 800 is formed through a self-aligned source process, the process step of lightly doped drain ion implantation for the transistor in the memory area is also performed.

FIG. 2 shows a schematic diagram of lightly doped drain ion implantation for the transistor in the memory area in the existing process. Specifically, a photo resist (PR) 600 is used for covering the peripheral logic control area B, and lightly doped drain ion implantation is performed only on the memory area A, so as to form a memory cell lightly doped drain CLDD 700 on an outer side of a gate structure of the memory transistor.

There is room for improvement for the existing process integration at least for the two aspects below:

1. After self-aligned source etching, the structure of the memory transistor source is complicated, so it is easy to include defects such as particles in the trench, and these defects may block some of the cell LDD implantation; and 2. The thermal budget may not be sufficient after cell LDD implantation, leading to unrepaired lattice damage caused by ion implantation and non-uniform ion diffusion.

The above two aspects may result in poor device uniformity among memory transistors. When an erase function of all memory cells on the same chip does not occur in the same interval, a serious condition such as an erase failure may result in poor device performance.

Therefore, a proper manufacturing method for solving this problem is urgently needed, so as to improve the poor uniformity of lightly doped drain ion implantation of the memory cell of the flash memory device in the current process.

BRIEF SUMMARY

The following is a summary of the disclosure. This summary is not an extensive overview of all conceivable aspects and is not intended to identify key or critical elements of all aspects or delimit the scope of any or all aspects. The sole purpose is to present some concepts of one or more aspects in a simplified form as a prelude to more detailed description that is presented later.

A manufacturing method for a semiconductor device, comprising: providing a substrate comprising a memory area and a peripheral area, wherein the memory area comprises a memory transistor having a memory gate structure, wherein the peripheral area comprises a peripheral transistor having a peripheral gate structure, and wherein the peripheral gate structure comprises a first layer; performing ion implantation to form a lightly doped drain on two sides of the memory gate structure of the memory transistor on an upper part of the memory area of the substrate, wherein the first layer masks the peripheral area; and etching the first layer to form the peripheral gate structure of the peripheral transistor.

Optionally, the manufacturing method further comprises: performing gate re-oxidation treatment on the memory gate structure of the memory transistor and the peripheral gate structure of the peripheral transistor, wherein the gate re-oxidation treatment thermally treats the lightly doped drain.

Optionally, the manufacturing method further comprises: performing a self-aligned source process to form a source of the memory transistor on the upper part of the memory area of the substrate, wherein the lightly doped drain is thermally treated in the self-aligned source process.

Optionally, the self-aligned source process further comprises: performing a self-aligned source etching, a self-aligned source ion implantation and a self-aligned source annealing, wherein the lightly doped drain is thermally treated in the self-aligned source annealing.

Optionally, the memory area of the substrate comprises a stacked gate layer of the memory transistor formed on the upper surface of the memory area of the substrate; and wherein the stacked gate layer is etched to form the memory gate structure of the memory transistor.

Optionally, the method further comprising: sequentially from bottom up depositing a memory gate dielectric layer, a floating gate layer, a dielectric interlayer and a control gate layer on an upper surface of the memory area of the substrate.

Optionally, the first layer comprises a peripheral gate dielectric layer and a peripheral gate layer on the peripheral gate dielectric layer sequentially deposited on an upper surface of the peripheral area of the substrate.

Optionally, the peripheral gate dielectric layer of the peripheral area and the memory gate dielectric layer of the memory area are formed in a same process step.

Optionally, the peripheral gate layer of the peripheral area and the control gate layer of the memory area are formed in a same process step.

Optionally, the peripheral gate layer of the peripheral area and the control gate layer of the memory area comprise polycrystalline silicon.

In one embodiment of the above manufacturing method, optionally, the gate layer of the peripheral area and the CG layer of the memory area are formed in the same step.

In one embodiment of the above manufacturing method, optionally, the gate layer of the peripheral area and the CG layer of the memory area are polycrystalline silicon.

According to the manufacturing method for the semiconductor device provided in the present invention, the step of lightly doped drain ion implantation in the memory area is executed, and on the premise that we don't change the structure and the design of the original device and adjusting the ion implantation conditions, the physical structure before implantation is simpler, the possibility that implanted ions are blocked by defects is reduced, and in addition, damage caused by ion implantation is repaired by means of increased thermal budget from the subsequent process, and at the same time the ion diffusion is more uniform. Finally, the effect of improving the electrical uniformity of the memory cell is achieved, and the yield and the erase performance of the flash memory cell are effectively improved. Moreover, according to the manufacturing method for the semiconductor device provided in the present invention, when lightly doped drain ion implantation is performed on the memory area, no need to add the photo resist in the peripheral device area, such that we can save a layer of photomask, thus the manufacturing cost may be reduced.

BRIEF DESCRIPTION OF THE DRAWINGS

The foregoing features and advantages of the present invention can be better understood upon reading the detailed description of embodiments of the present disclosure in conjunction with the following drawings. In the drawings, the components are not necessarily drawn to scale, and components having similar related characteristics or features may have the same or similar reference numbers.

FIG. 5 shows a structural schematic diagram after performing lightly doped drain ion implantation in the memory area according to one embodiment of the present disclosure.

REFERENCE NUMBERS

Figure 1:
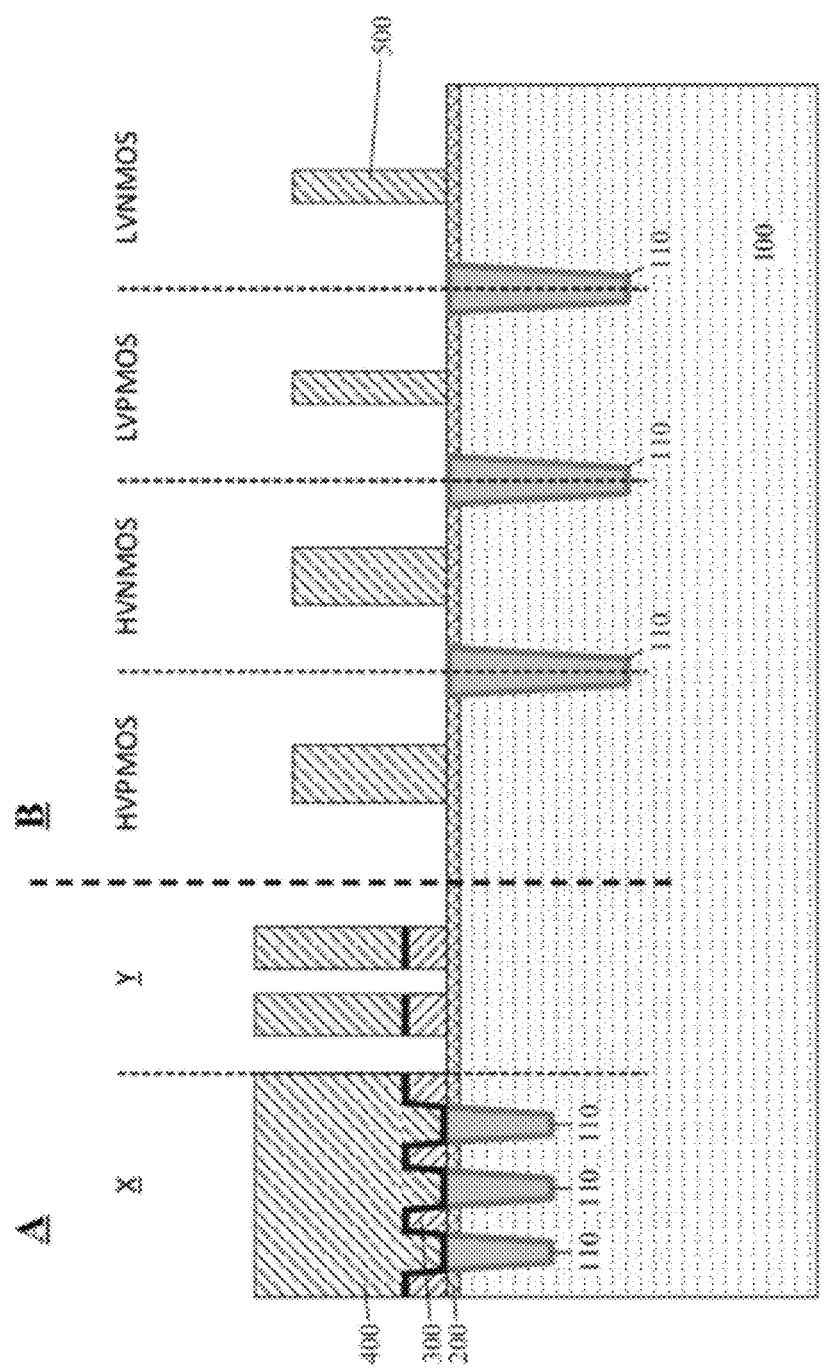
FIG. 1 shows a schematic diagram of a device structure after formation of a CG and a PG in the existing device.

| | |
|---|---|
| 100 | Substrate |
| 110 | Shallow trench isolation STI |
| 200 | Gate dielectric layer |
| 300 | Floating gate or FG |
| 400 | Control gate or CG |
| 500 | Peripheral device poly gate |
| 520 | Gate layer |
| 600 | Photo resist or PR |
| 700 | Memory cell lightly doped drain CLDD |
| 800 | Self-aligned source SAS |

DETAILED DESCRIPTION OF THE DISCLOSURE

The present invention will be described in detail in conjunction with the accompanying drawings and the specific embodiments. It should be noted that the aspects described below in conjunction with the accompanying drawings and the specific embodiments are merely exemplary and should not be construed as limiting the scope of protection of the present invention.

The present invention relates to a manufacturing method for a semiconductor device. According to one embodiment of the present disclosure, to avoid the two weaknesses of an existing cell LDD implantation process, by carrying out the step of light doped drain ion implantation in the storage area in advance, on the premise without changing the structure and the design of an original device and keeping the ion implantation conditions, the physical structure before implantation is simpler, thus the possibility to have implanted ions blocked by defects is reduced, in addition, damage caused by ion implantation is also repaired by means of thermal budget from a subsequent process, and at the same time, the ion diffusion becomes more uniform. Finally, the uniformity of the memory cell's electrical functions is improved, the flash memory cell has better erase performance, and the overall yield is increased. Moreover, according to the manufacturing method in the present invention, when lightly doped drain ion implantation is performed on the memory area, no need to add photo resist in the peripheral device area, one photomask is saved, therefore the manufacturing cost is reduced.

The following description is provided to enable those skilled in the art to implement and use the present invention and incorporate it into a specific application background. Various modifications, as well as various uses in different applications, will be readily apparent to those skilled in the art, and the general principles defined herein may be applied to embodiments in a broader range. Thus, the present invention is not limited to the embodiments presented herein but is to encompass the broadest scope consistent with the principles and novelty features disclosed herein.

In the following detailed description, numerous specific details are set forth in order to provide a more thorough understanding of the present invention. However, it will be apparent to those skilled in the art that the practice of the present invention may not be limited to these specific details. In other words, well-known structures and devices are shown in block diagram forms without detail in order to avoid obscuring the present invention.

A reader may note that all documents and literatures which are filed concurrently with this specification and which are open to public inspection to this specification and the contents of all such documents and literatures are incorporated herein by reference. All features disclosed in this specification (including any appended claims, abstract and drawings) may be replaced with alternative features serving the same, equivalent or similar purpose, unless otherwise indicated directly. Thus, unless otherwise stated expressly, each feature disclosed is only one example of a set of equivalent or similar features.

It is to be noted that when used, the signs left, right, front, back, top, bottom, forward, reverse, clockwise, and counterclockwise are used merely for the purpose of convenience and do not imply any particular fixed orientation. In fact, they are used to reflect a relative position and/or orientation between various parts of an object.

The terms, "over", "under", "between", and "on" used herein refer to the relative position of this layer with respect to other layers. Likewise, for example, one layer deposited or placed over or under another layer may make direct contact with another layer or may have one or more intermediate layers. Further, a layer deposited or placed between layers may make direct contact with these layers, or may have one or more intermediate layers. In contrast, a first layer, "on" a second layer, makes contact with the second layer. Further, the relative position of one layer with respect to other layers is provided (assuming deposition, modification, and removal operations of a thin film with respect to an initial substrate irrespective of the absolute orientation of the substrate).

Figure 3:
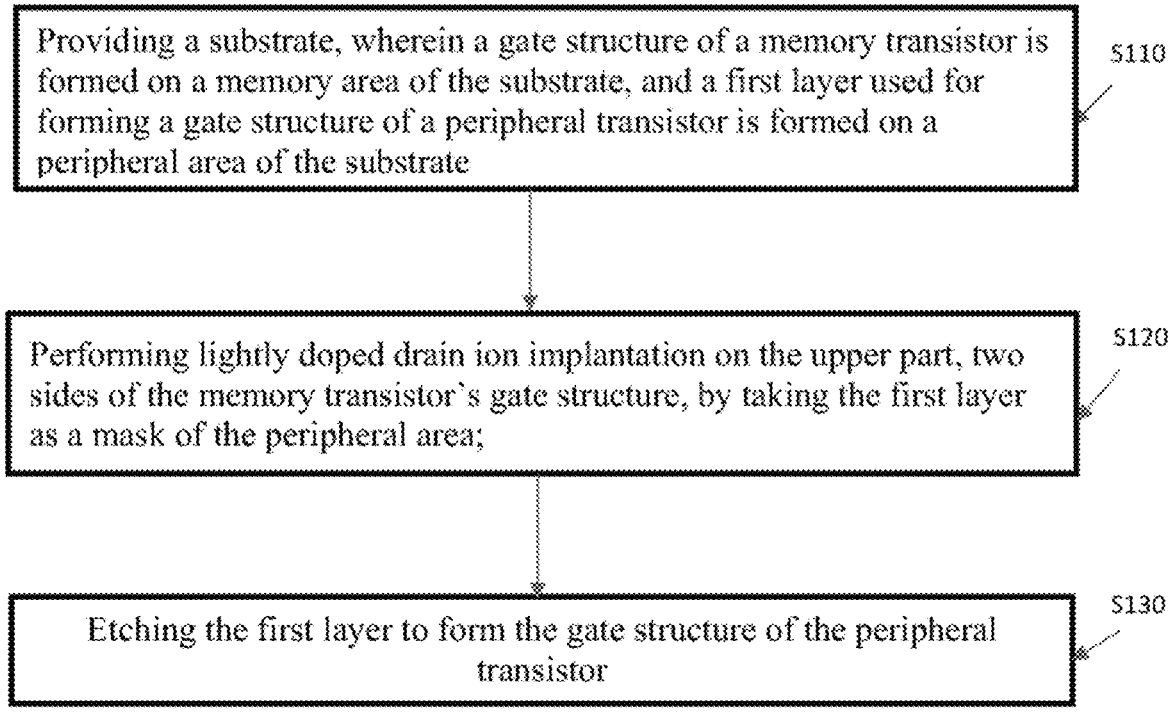
FIG. 3 shows a schematic flow chart of a manufacturing method in accordance with the present disclosure.

As described above, for improving the poor uniformity of lightly doped drain ion implantation of the memory cell of the flash memory in the existing process, as well as improving the uniformity of electrical functions among the memory cells, the disclosed provides a manufacturing method for the memory device, and FIG. 3 shows a schematic flow chart of a manufacturing method in accordance with the present disclosure. As shown in FIG. 3, the method provided in the present disclosure includes step S110: providing a substrate, wherein a gate structure of a memory transistor is formed in a memory area of the substrate, and a first layer used for forming a gate structure of a peripheral transistor is formed in a peripheral area of the substrate; step S120: performing lightly doped drain ion implantation on an upper part of a portion, on two sides of the gate structure of the memory transistor, of the memory area of the substrate by taking the first layer as a mask of the peripheral area; and step S130: etching the first layer to form the gate structure of the peripheral transistor.

According to one embodiment of the present disclosure, to avoid the two weaknesses of an existing cell LDD implantation process. By carrying out the step of light doped drain ion implantation in the storage area in advance, on the premise without changing the structure and the design of an original device and keeping the ion implantation conditions, the physical structure before implantation is simpler, thus the possibility to have implanted ions blocked by defects is reduced, in addition, damage caused by ion implantation is also repaired by means of thermal budget from a subsequent process, and at the same time, the ion diffusion becomes more uniform. Finally, the uniformity of the memory cell's electrical functions is improved, the flash memory cell has better erase performance, and the overall yield is increased.

Moreover, according to the manufacturing method in the present invention, when lightly doped drain ion implantation is performed on the memory area, no need to add photo resist in the peripheral device area, one photomask is saved, therefore the manufacturing cost is reduced.

It should be noted that those skilled in the art may adjust related parameters of lightly doped drain ion implantation according to actual conditions of the device, and the lightly doped drain ion implantation may be achieved by other means of practical process. The related parameters and specific implementations for lightly doped drain ion implantation should not unduly limit the scope of protection of the present invention.

In one embodiment, the manufacturing method provided in the present invention further includes: performing gate re-oxidation treatment on the gate structure of the memory transistor and the gate structure of the peripheral transistor. By means of the gate re-oxidation treatment, an oxide layer is formed on a surface of the gate structure for protection, and implanted lightly doped drain ions will be thermally treated in the gate re-oxidation treatment. The lightly doped drain ions in the memory area are therefore thermally treated in the gate re-oxidation treatment, such that without additional thermal budget, the diffusion uniformity of the lightly doped drain ions in the memory area is improved, and the ion implantation damage from lightly doped drain ions will be repaired.

It should be noted that in the embodiment described above, those skilled in the art may employ other semiconductor processes to achieve gate re-oxidation treatment. The specific implementation of the gate re-oxidation treatment should not unduly limit the scope of protection of the present invention.

In another embodiment, the manufacturing method provided in the present invention further includes: performing an upper part self-aligned source process to form the memory transistor source in the memory area of the substrate.

In the embodiment described above, the self-aligned source process may include: performing self-aligned source etching, self-aligned source ion implantation, and self-aligned source annealing. Those skilled in the art may employ another self-aligned source process to form a common source for a similar memory transistors. An implementation method for specific steps of the self-aligned source process and a mutual relation between the steps should not unduly limit the scope of the protection of the present invention.

Due to the fact that the annealing step is included in the self-aligned source process, the implanted lightly doped drain ions into the source will be thermally treated during the self-aligned source process. The lightly doped drain ions in the memory area are thermally treated in the step of forming the self-aligned common source, such that the diffusion uniformity of the lightly doped drain ions in the memory area may be improved without additional thermal budget, and the implantation damage from the lightly doped drain ions will be properly repaired.

Further, in the present invention, lightly doped drain ion implantation in the memory area is performed after forming the gate of the memory transistor in the memory area and before forming the gate of the related peripheral device in the peripheral control area.

According to another embodiment of the manufacturing method provided in the present invention, the manufacturing method further includes: forming a gate of a memory transistor in a memory area and a gate of a related peripheral device in a peripheral control area. Specifically, the manufacturing method includes: forming the gate of the memory transistor in the memory area, followed by performing lightly doped drain ion implantation in the memory area.

Forming the gate of the memory transistor in the memory area includes: forming a stacked gate layer on an upper surface of the memory area of the substrate, and etching the stacked gate layer to form a gate structure of the memory transistor.

The stacked gate layer described above specifically includes a gate dielectric layer, a floating gate layer, an interlayer dielectric layer and a control gate layer, all of which are stacked on the upper surface of the substrate from bottom up. The gate dielectric layer may be made of a gate dielectric material, which includes, but not limited to, an oxide or a high-K dielectric material. The floating gate layer may be formed of polycrystalline silicon. The interlayer dielectric layer is an insulator and may include, but not limited to, an oxide-nitride-oxide (ONO) stacked layer. The control gate layer may be formed of polycrystalline silicon.

Forming a gate of a related peripheral device in a peripheral control area includes: forming a first layer used for forming the gate of the peripheral device on an upper surface of the peripheral control area of the substrate, and etching the first layer to make a gate structure of the related peripheral device.

The first layer described above specifically includes a gate dielectric layer on the upper surface of the substrate and a gate layer on top of the gate dielectric layer. The gate dielectric layer may be made of a gate dielectric material, which includes, but not limited to, an oxide or a high-K dielectric material. The gate layer may be formed of polycrystalline silicon.

In one embodiment, the memory transistor in the memory area and the related peripheral device in the peripheral control area are both formed on the same substrate. The substrate described above can be an elemental semiconductor, including crystalline silicon or crystalline germanium; polycrystalline or amorphous silicon or germanium; a III-V or IV-VI compound semiconductors, such as silicon carbide (SiC), silicon germanium (SiGe), gallium arsenide (GaAs), gallium phosphide (GaP), indium phosphide (InP), indium arsenide (InAs), indium antimonide (InSb), gallium arsenic phosphide (GaAsP), aluminum indium arsenide (AlInAs), aluminum gallium arsenide (AlGaAs), gallium indium arsenide (GaInAs), gallium indium phosphide (GaInP) or gallium indium arsenic phosphide (GaInAsP); and any other suitable material or a combination of the foregoing.

In one embodiment, the gate dielectric layers of the memory area and the peripheral control area may be formed on the upper surfaces of the memory area and the peripheral control area of the substrate at the same time. In addition, the control gate layer of the memory area and the gate layer of the peripheral control area may be formed in the same process step too.

In the manufacturing method provided in the present invention, lightly doped drain ion implantation for the memory area is performed after etching to form the gate of the memory transistor of the memory area and before etching to form the gate of the related peripheral device in the peripheral control area. When performing lightly doped drain ion implantation for the memory area, the first layer of the peripheral control area may serve as a barrier layer of the peripheral control area, such that no need to add a photo resist as the barrier layer, in the peripheral device area, thereby saving a photomask, and reducing the manufacturing cost.

Figure 4:
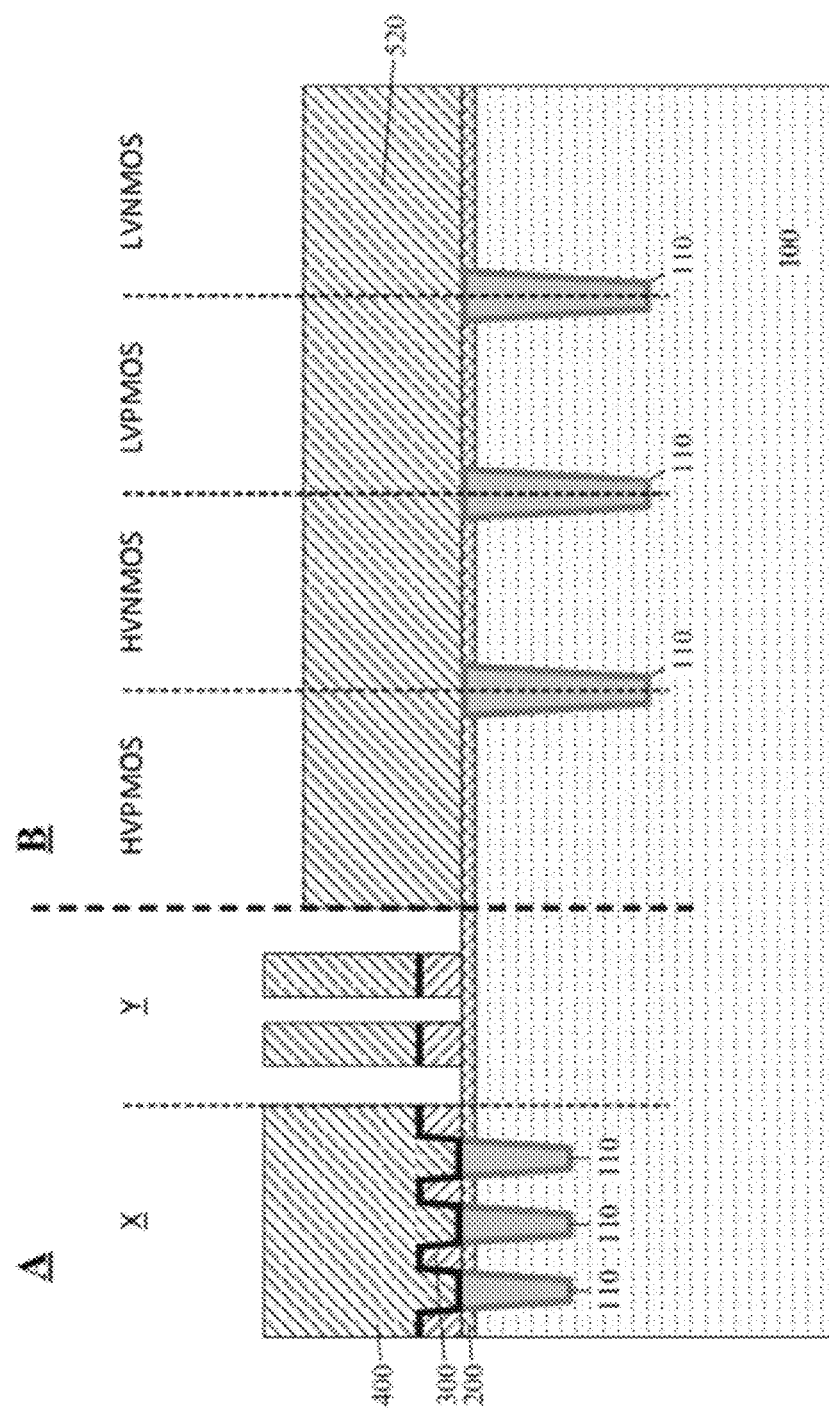
FIG. 4 shows a structural schematic diagram after etching a control gate of the memory area according to one embodiment of the present invention.

The manufacturing method provided in the present invention will be better understood in conjunction with FIGS. 4 and 5. FIG. 4 shows a structural schematic diagram after etching the control gate of the memory area according to the manufacturing method of the present invention. The memory area A and the peripheral logic control area B are predefined on a substrate 100 as shown in FIG. 4. The memory transistors are formed in the memory area A, and various peripheral logic control transistors are formed in the peripheral logic control area B. As shown in FIG. 4, the peripheral logic control transistors include, but not limited to, high-voltage P-type MOS transistors (HVPMOS), high-voltage N-type MOS transistors (HVNMOS), low-voltage P-type MOS transistors (LVPMOS) and low-voltage N-type MOS transistors (LVNMOS). A structure of the memory transistor is illustrated in FIG. 4 from an X-direction parallel to the gate of the memory transistor and a Y-direction exposing a profile of the gate of the memory transistor separately.

As can be seen from FIG. 4, shallow trench isolations (STI) 110 are fabricated in the substrate 100 to separate physically and to isolate electrically memory cells and peripheral devices from one another.

Gate dielectric layers 200 are formed on the upper surface of both the memory area A and the peripheral logic control area B of the substrate 100. In one embodiment, the gate dielectric layers 200 of the memory area A and the peripheral logic control area B are formed in the same step.

The FG 300 of the memory transistor is formed on the upper surface of the gate dielectric layer 200 of the memory area A, the CG 400 of the memory transistor is formed over the FG 300, and the FG 300 and the CG 400 are isolated from each other by means of a dielectric interlayer.

A gate layer 520 used for the gate of the related peripheral control device to be formed is formed on an upper surface of the gate dielectric layer 200 of the peripheral logic control area B, and as described above, the gate layer 520 and the CG layer 400 may be deposited in the same step. In one embodiment, the CG 400 and the gate layer 520 of the memory area A may be made of polycrystalline silicon.

As can be seen from the Y direction in FIG. 4, a stacked gate layer of the memory area is etched, thereby forming the gate structure of the memory transistor. For the peripheral logic control area B, the gate layer 520 has not been etched, therefore the gate of the related peripheral device has not been formed at this point.

Subsequently, according to the manufacturing method disclosed according to the present invention, lightly doped drain ions are implanted into the surface of the memory area A as in the structure FIG. 4. As shown in FIG. 5, after etching the gate of the memory cell and before etching the peripheral gate, the gate layer 520 of the peripheral logic control area serves as a mask during performing the lightly doped drain implantation for the memory area A. Therefore, in the step of performing lightly doped drain implantation for the memory area A, no need for an additional photo resist as the protection layer, thereby reducing the manufacturing cost.

As shown in FIG. 5, a memory cell lightly doped drain (CLDD) 700 is formed on an upper part of a portion, on both sides of the gate of the memory transistor in the memory area A, of the substrate 100 after lightly doped drain implantation for the memory area A is performed.

Figure 2:
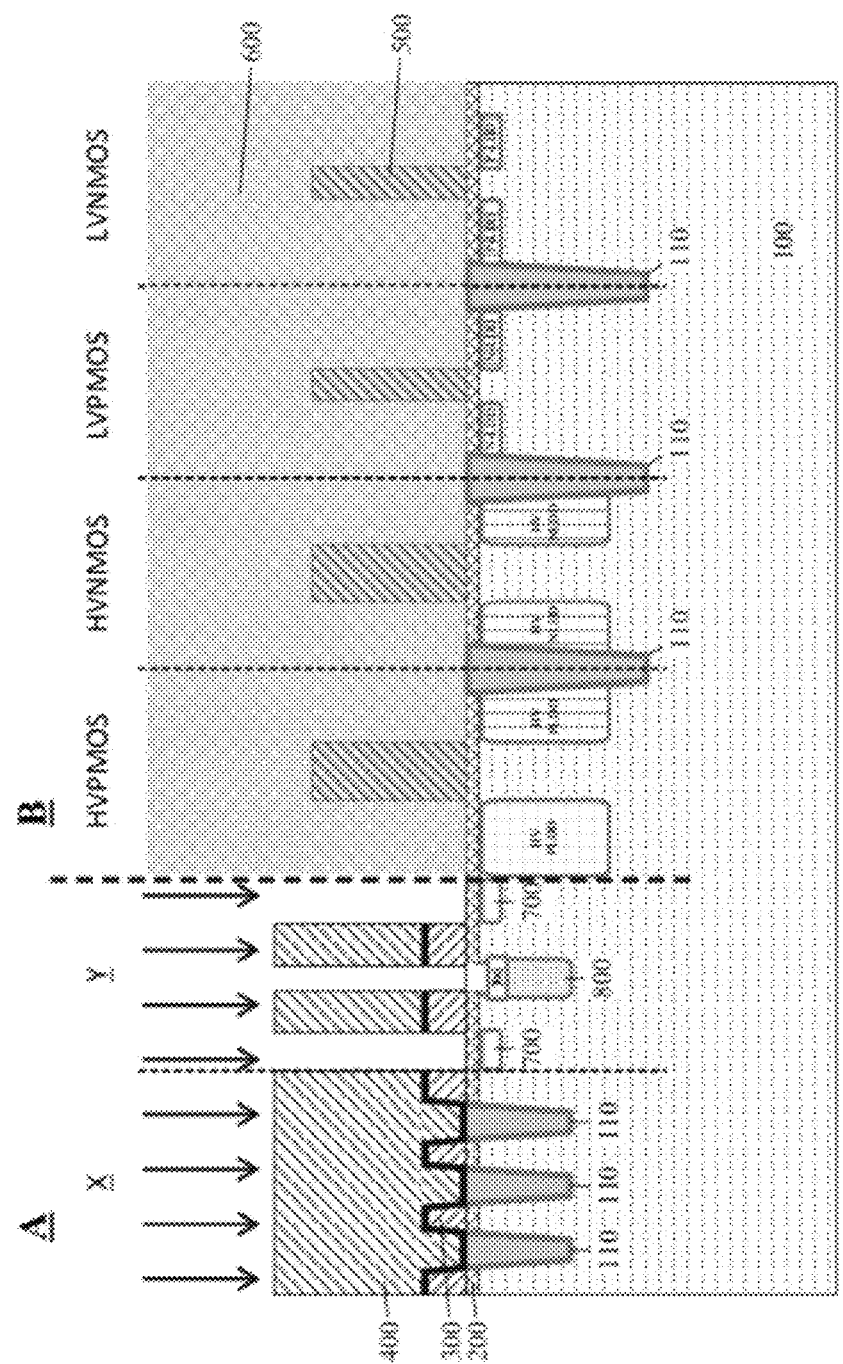
FIG. 2 shows a schematic diagram after performing lightly doped drain ion implantation in the memory area in the existing device.

After performing the lightly doped drain implantation for the memory area A, the manufacturing method provided in the present invention further includes: etching the gate layer 520 in the peripheral logic control area B to form various peripheral device gates 500 similarly as shown in FIGS. 1 and 2.

In another embodiment, after etching to form the peripheral device gates 500, the manufacturing method provided in the present invention further includes: performing gate re-oxidation treatment on the gate structure of the memory transistor and the gate structure of the peripheral transistor. By means of the gate re-oxidation treatment, an oxide layer will be formed on the surface of the gate structures for protection, and the implanted ions in the lightly doped drain will be thermally treated in the gate re-oxidation treatment, such that the lightly doped drain ions will have more diffusion uniformity in the memory area without increasing its thermal budget, in addition, the implantation damage from drain doping will be repaired.

It should be noted that applying the embodiments described above, those skilled in the art may employ other semiconductor process to achieve gate re-oxidation treatment, and the specific implementation of the gate re-oxidation treatment should not unduly limit the scope of protection of the present invention.

In another embodiment, the manufacturing method provided in the present invention further includes: performing a self-aligned source process on the upper part of the portion, corresponding to a source of the memory transistor, of the memory area of the substrate, to form the source of the memory transistor.

In the embodiment described above, the self-aligned source process may further include: performing self-aligned source etching, self-aligned source ion implantation, and self-aligned source annealing. It can be understood that those skilled in the art may employ a similar self-aligned source process to form a common source for the memory transistors as described above. An implementation method for specific steps of the self-aligned source process and relationships among the steps should not unduly limit the scope of the protection of the present invention.

Due to the fact that the annealing step is included in the self-aligned source process, the implanted ions in the lightly doped drain may be thermally treated by means of the self-aligned source process. The lightly doped ions in the drain of the memory area are thermally treated in the step of forming the self-aligned common source, such that without any additional thermal budget, the ion diffusion uniformity of the lightly doped drain in the memory area may be improved, and the implantation damage caused by lightly doped ions in the drain is repaired.

It can be understood that since lightly doped drain ion implantation for the memory area A is completed in the previous process, no additional lightly doped drain ion implantation for the memory area A is performed during the self-aligned source (SAS) process.

According to one embodiment of the present disclosure, to avoid the two weaknesses of an existing cell LDD implantation process. by carrying out the step of light doped drain ion implantation in the storage area in advance, on the premise without changing the structure and the design of an original device and keeping the ion implantation conditions, the physical structure before implantation is simpler, thus the possibility to have implanted ions blocked by defects is reduced, in addition, damage caused by ion implantation is also repaired by means of thermal budget from a subsequent process, and at the same time, the ion diffusion becomes more uniform. Finally, the uniformity of the memory cell's electrical functions is improved, the flash memory cell has better erase performance, and the overall yield is increased.

Moreover, according to the manufacturing method for the semiconductor device provided in the present invention, when lightly doped drain ion implantation is performed on the memory area, no need for a layer of photo resist to form in the peripheral device area, so to save photomask and reduce manufacturing cost.

While the present disclosure has been described by means of specific exemplary embodiments, it will be apparent that various modifications and changes may be made to these embodiments without departing from the broader spirit and scope of the present disclosure. Accordingly, the specification and accompanying drawings should be deemed as an illustrative meaning rather than a restrictive meaning.

It should be appreciated that the specification is not to be used to interpret or limit the scope or meaning of the claims. In addition, in the foregoing detailed description, it can be seen that various features are combined together in a single embodiment for the purpose of simplifying the present disclosure. This method of the present disclosure should not be interpreted as reflecting an objective that the claimed embodiments require more features than those are expressly recited in each claim. On the contrary, as the appended claims reflect, an inventive subject matter lies in employing features less than all features of a single disclosed embodiment. Thus, the appended claims are hereby incorporated into the detailed description, with each claim standing on its own as a separate embodiment.

One embodiment, or a particular feature, structure, or characteristic described in conjunction with the embodiments, referred in this description are included in at least one embodiment of a circuit or method. A phrase, one embodiment, appearing in various places in the specification do not necessarily all refer to the same embodiment.

What is claimed is:

1. A manufacturing method for a semiconductor device, comprising:
    providing a substrate with a stacked gate layer of a memory transistors formed on a memory area of an upper surface of the substrate, and providing a first layer for a gate structure of a peripheral transistor on a peripheral area of the substrate;
    performing lightly doped drain ion implantation on an upper part of a portion, on two sides of the gate structure of the memory transistor, of the memory area of the substrate by taking the first layer as a mask of the peripheral area;
    etching the first layer to form the peripheral gate structure of the peripheral transistor; and
    etching the stacked gate layer to form the gate structure of the memory transistor;
        wherein the providing the substrate with the stacked gate layer of the memory transistor formed on the upper surface further comprises:
        sequentially depositing a memory gate dielectric layer, a floating gate layer, a dielectric interlayer and a control gate layer from bottom up on the upper surface of the memory area of the substrate;
        wherein the providing the substrate with the first layer formed further comprises:
        sequentially depositing a gate dielectric layer and a gate layer on a upper surface of the peripheral area of the substrate from bottom to top to form the first layer; and wherein the peripheral gate dielectric layer of the peripheral area and the memory gate dielectric layer of the memory area are formed in a same process step.

2. The manufacturing method of claim 1, wherein the manufacturing method further comprises:

performing gate re-oxidation treatment on the memory gate structure of the memory transistor and the peripheral gate structure of the peripheral transistor, wherein the gate re-oxidation treatment thermally treats the lightly doped drain.

3. The manufacturing method of claim 1, wherein the manufacturing method further comprises:

performing a self-aligned source process on an upper part of a portion of the memory area of the substrate to form a source of the memory transistor, wherein the self-aligned source is the source of the memory transistor; wherein implanted lightly doped drain ions are thermally treated in the self-aligned source process.

4. The manufacturing method of claim 3, wherein the self-aligned source process further comprises:

performing a self-aligned source etching, a self-aligned source ion implantation and a self-aligned source annealing, wherein the lightly doped drain is thermally treated in the self-aligned source annealing.

5. The manufacturing method of claim 1, wherein the peripheral gate layer of the peripheral area and the control gate layer of the memory area are formed in a same process step.

6. The manufacturing method of claim 1, wherein the peripheral gate layer of the peripheral area and the control gate layer of the memory area comprise polycrystalline silicon.

* * * * *